United States Patent [19]
Ishimura

[11] Patent Number: 5,942,771
[45] Date of Patent: Aug. 24, 1999

[54] SEMICONDUCTOR PHOTODETECTOR

[75] Inventor: Eitaro Ishimura, Tokyo, Japan

[73] Assignee: Mitsubishi Denki Kabushiki Kaisha, Tokyo, Japan

[21] Appl. No.: 08/922,597

[22] Filed: Sep. 3, 1997

[30] Foreign Application Priority Data

Apr. 14, 1997 [JP] Japan ..................... 9-095709

[51] Int. Cl.⁶ ............... H01L 31/105; H01L 31/107; H01L 31/0304
[52] U.S. Cl. ............ 257/184; 257/186; 257/196; 257/436
[58] Field of Search .................. 257/186, 184, 257/196, 436

[56] References Cited

U.S. PATENT DOCUMENTS

| | | | |
|---|---|---|---|
| 4,701,773 | 10/1987 | Kaneda | 257/186 |
| 5,406,097 | 4/1995 | Kusakabe | 257/186 |
| 5,420,418 | 5/1995 | Fujimura et al. | 250/214.1 |
| 5,569,942 | 10/1996 | Kusakabe | 257/186 |

FOREIGN PATENT DOCUMENTS

| | | | |
|---|---|---|---|
| 59-232470 | 12/1984 | Japan | 257/186 |
| 61-196572 | 8/1986 | Japan | 257/436 |
| 3-73576 | 3/1991 | Japan | 257/186 |
| 4-97574 | 3/1992 | Japan | 257/186 |

*Primary Examiner*—Jerome Jackson, Jr.
*Attorney, Agent, or Firm*—Leydig, Voit & Mayer, Ltd.

[57] ABSTRACT

A semiconductor photodetector includes a semiconductor substrate of a first conductivity type; a light absorption recombination layer disposed on a front surface of the semiconductor substrate and having a band gap energy smaller than the semiconductor substrate; a first conductivity type barrier layer disposed on the light absorption recombination layer and having a band gap energy larger than the light absorption recombination layer; an undoped light absorption layer disposed on the barrier layer and having a band gap energy larger than the light absorption recombination layer and smaller than the barrier layer; an undoped window layer disposed on the light absorption layer and having a band gap energy larger than the light absorption layer; and an impurity doped region of a second conductivity type in a region extending from the window layer to the light absorption layer. A portion of incident light not absorbed in a depletion layer in the light absorption layer is absorbed by the light absorption recombination layer, and electrons and holes generated in the light absorption recombination layer recombine immediately, resulting in reduced response distortion.

2 Claims, 6 Drawing Sheets

SEMICONDUCTOR PHOTODETECTOR

FIELD OF THE INVENTION

The present invention relates to a semiconductor photodetector having reduced response distortion, for use in analog light transmission.

BACKGROUND OF THE INVENTION

FIGS. 8(a) and 8(b) are a cross-sectional view and a top plan view, respectively, illustrating an InGaAs series semiconductor photodiode (hereinafter, referred to as a PD) as an example of a conventional photodetector. In the figures, reference numeral 1 designates a p side electrode comprising Ti/Au or the like. Reference numeral 2 designates a surface protection film comprising silicon nitride (SiN) or the like and having a thickness equal to ¼ of wavelength λ of light incident on the PD. Reference numeral 3 designates an undoped (hereinafter, referred to as i type) InP window layer having a thickness of about 2 µm. Reference numeral 4 designates an i type InGaAs light absorption layer having a thickness of 2~3 µm. Reference numeral 5 designates a p type doped region having a carrier concentration of $1 \times 10^{19} \sim 1 \times 10^{20}$ cm$^{-3}$, which is formed by diffusing Zn from the surface of the window layer 3 to reach into the light absorption layer 4, and its depth in the light absorption layer 4 is 0.1~0.3 µm. Reference numeral 1a designates a bonding pad disposed on the surface protection film 2 in a region outside the Zn doped region 5. This bonding pad 1a is produced simultaneously with the p side electrode 1 and connected to the p side electrode 1. Reference numeral 6 designates a depletion layer. Reference numeral 7 designates an n type InP substrate containing a dopant impurity, such as silicon (Si) or sulfur (S), and having a carrier concentration of about $5 \times 10^{18}$ cm$^{-3}$. Reference numeral 8 designates an n side electrode comprising AuGe/Au. Reference numeral 9 designates incident light, for example, laser light having a wavelength λ of 1.3 µm, and reference numeral 10 designates reflected light. That is, a portion of the incident light 9, which has not been absorbed in the light absorption layer 4, is reflected at the n side electrode 8.

A description is given of the operation of the PD so constructed.

When light 9 having a wavelength λ of 1.3 µm is applied to the doped region 5 from the top of the PD, this incident light 9 travels through the surface protection film 2 and the InP window layer 3 and is absorbed in the InGaAs light absorption layer 4, thereby generating electrons and holes. The reason why the InP window layer 3 is transparent to the incident light 9 is because the incident light wavelength (λ=1.3 µm) is longer than the wavelength (λg=0.92 µm) equivalent to the band gap energy of InP. At this time, in the light responsive region, i.e., a region of the i type InGaAs light absorption layer 4 opposite the doped region 5, a depletion layer 6 is produced by a pn junction that is formed between the p type doped region 5 and the n type substrate 7. That is, between the p type doped region 5 and the n type substrate 7, an electric field is applied in the InGaAs light absorption layer 4. Electrons and holes generated by light absorption in the depletion layer 6 in the light absorption layer 4 are pulled by the electric field and flow toward the n type InP substrate 7 and the p type doped region 5, respectively. This flow is called a photocurrent. The photocurrent is taken out as a signal current from the p side electrode 1 and the n side electrode 8. Further, a reverse bias of about −5V may be applied across the p side electrode 1 and the n side electrode 8 as desired.

A portion of the incident light 9, more specifically, several % of the incident light 9, is transmitted without being absorbed by the light absorption layer 4. When the light absorption layer 4 is sufficiently thick, for example, 5 µm or more, it absorbs almost 100% of the incident light. However, when the light absorption layer 4 is thicker than 3 µm, the light absorption layer 4 becomes slightly n type because a small amount of dopant impurity intrudes into the layer during the fabrication process although the light absorption layer 4 itself is intended to be undoped. Therefore, the light absorption layer 4 is not depleted at all, and generated electrons and holes remain in the light absorption layer 4 beneath the doped region 5. Accordingly, the thickness of the light absorption layer 4 is usually set at about 3 µm or less and, as a result, a portion of the incident light 9 is not absorbed in the depletion layer 6 in the light absorption layer 4 but passes through the light absorption layer 4. The traveling light is reflected by the n side electrode 8, and the reflected light is input to an undepleted region (hereinafter referred to as a non-depletion region) in the light absorption layer 4 as well and absorbed in this region. Since the electric field generated in the depletion layer is not applied to the non-depletion region, electrons and holes generated by absorption of the reflected light 10 remain in this region. These electrons and holes reach the depletion layer 6 by diffusion and are taken out as a photocurrent. However, since it takes time for the electrons and holes to reach the depletion layer 6 after the light absorption, generation of this photocurrent in response to the incident light signal is delayed. When a photocurrent having such a delay is added to the photocurrent directly taken out of the depletion layer 6, distortion is generated in the response of the PD, i.e., the signal waveform is distorted. Although a PD is desired to have a sufficiently reduced response distortion, because the reflected light adversely affects the response of the PD as mentioned above, the response distortion increases to −80 dBc. As a result, it is impossible to realize a high-performance semiconductor photodetector.

SUMMARY OF THE INVENTION

It is an object of the present invention to provide a semiconductor photodetector with reduced response distortion.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor photodetector comprises a semiconductor substrate of a first conductivity type, having a band gap energy and front and rear surfaces; a light absorption recombination layer disposed on the front surface of the semiconductor substrate and comprising a semiconductor layer containing a dopant impurity and having a band gap energy smaller than the band gap energy of the semiconductor substrate; a barrier layer disposed on the light absorption recombination layer and comprising a first conductivity type semiconductor layer having a band gap energy larger than the band gap energy of the light absorption recombination layer; a light absorption layer disposed on the barrier layer and comprising an undoped semiconductor layer having a band gap energy larger than the band gap energy of the light absorption recombination layer and smaller than the band gap energy of the barrier layer; a window layer disposed on the light absorption layer and comprising an undoped semiconductor layer having a band gap energy larger than the band gap energy of the light absorption layer; and an impurity doped region containing a dopant impurity of a second conductivity type, opposite the first conductivity type, produced in a prescribed region reaching the surface of the window layer and having a depth reaching into the light absorption layer. Therefore, a portion of incident light, which has not been absorbed by a depletion layer in the light absorption layer, is absorbed by the light absorption and recombination layer, and electrons and holes generated in the light absorption and recombination layer do not remain but are forfeited immediately, thereby reducing response distortion caused by that remaining electrons and holes flow into the depletion layer.

According to a second aspect of the present invention, a semiconductor photodetector comprises a semiconductor substrate of a first conductivity type, having a band gap energy, front and rear surfaces, and a projecting portion that projects outwards from the rear surface; a light absorption layer disposed on the front surface of the substrate and comprising an undoped semiconductor layer having a band gap energy smaller than the band gap energy of the semiconductor substrate; a window layer disposed on the light absorption layer and comprising an undoped semiconductor layer having a band gap energy larger than the band gap energy of the light absorption layer; an impurity doped region containing a dopant impurity of a second conductivity type, opposite the first conductivity type, and produced in a prescribed region reaching the surface of the window layer and opposed to the projecting portion of the substrate, and having a depth reaching into the light absorption layer; a first electrode disposed on the rear surface of the substrate; and a second electrode disposed on a portion of the impurity doped region. Therefore, a portion of incident light, which has not been absorbed by a depletion layer in the light absorption layer, is reflected by the projecting portion of the substrate into the depletion layer, whereby response distortion is reduced and absorption efficiency of incident light is improved.

According to a third aspect of the present invention, a semiconductor photodetector comprises a semiconductor substrate of a first conductivity type, having a band gap energy and front and rear surfaces; a light absorption layer disposed on a portion of the front surface of the substrate, comprising an undoped semiconductor layer having a band gap energy smaller than the band gap energy of the semiconductor substrate; a window layer disposed on the light absorption layer and on the semiconductor substrate, comprising an undoped semiconductor layer having a band gap energy larger than the band gap energy of the light absorption layer; an impurity doped region containing a dopant impurity of a second conductivity type, opposite the first conductivity type, produced in a prescribed region reaching the surface of the window layer and opposed to the light absorption layer, and having a depth reaching into the light absorption layer; a first electrode disposed on the rear surface of the substrate; and a second electrode disposed on a portion of the impurity doped region. Therefore, the light absorption layer is disposed only in a depletion layer, so that light absorption does not occur in a region outside the depletion layer, resulting in reduced response distortion.

DETAILED DESCRIPTION OF THE PREFERRED EMBODIMENTS

Embodiment 1

Figure 1:
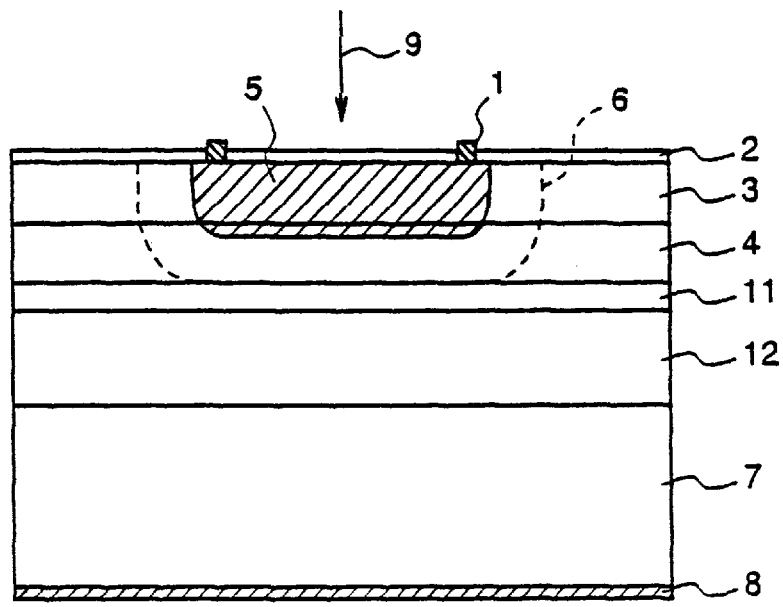
FIG. 1 is a cross-sectional view illustrating a semiconductor photodetector according to a first embodiment of the invention.

FIG. 1 is a cross-sectional view illustrating a semiconductor photodetector according to a first embodiment of the invention. In FIG. 1, reference numeral 1 designates a p side electrode comprising Ti/Au or the like. Reference numeral 2 designates a surface protection film comprising silicon nitride (SiN) or the like and having a thickness equal to ¼ of wavelength $\lambda$ of light incident on the device. Reference numeral 3 designates an undoped (i type) InP window layer having a thickness of about 2 $\mu$m. Reference numeral 4 designates an i type InGaAs light absorption layer having a thickness of 2~3 $\mu$m. Reference numeral 11 designates an n type InP barrier layer having a thickness of about 0.5 $\mu$m, containing sulfur (S) or silicon (Si) as a dopant impurity, and having a carrier concentration of $1 \times 10^{18}$ cm$^{-3}$. The barrier layer 11 may comprise another semiconductor having a band gap energy larger than that of the light absorption layer 4. Reference numeral 12 designates an InGaAs light absorption recombination layer containing a dopant impurity and having a thickness larger than about 2 $\mu$m. For example, S is added to the layer 12 to make a carrier concentration as high as $1 \times 10^{19}$ cm$^{-3}$. The composition of the light absorption recombination layer 12 is controlled so that its band gap energy is smaller than the band gap energy of the light absorption layer 4. Reference numeral 5 designates a p type doped region having a carrier concentration of $1 \times 10^{19}$~$1 \times 10^{20}$ cm$^{-3}$. The p type doped region 5 is formed by diffusing Zn from the surface of the window layer 3 to reach into the light absorption layer 4, and its depth in the light absorption layer 4 is 0.1~0.3 $\mu$m. Reference numeral 6 designates a depletion layer. Reference numeral 7 designates an n type InP substrate containing a dopant impurity, such as Si or S, and having a carrier concentration of about $5 \times 10^{18}$ cm$^{-3}$. Reference numeral 8 designates an n side electrode comprising AuGe/Au. Reference numeral 9 designates incident light, for example, laser light having a wavelength $\lambda$ of 1.3 $\mu$m.

The fabrication process of the photodetector will be described briefly. Initially, the n type InP substrate 7 is prepared, and the light absorption recombination layer 12, the barrier layer 11, the light absorption layer 4, and the window layer 3 are successively epitaxially grown on the substrate 7, preferably by MOCVD (Metal Organic Chemical Vapor Deposition). Next, Zn region of the so a prescribed region of the structure from the surface of the window layer 3, reaching into the light absorption layer 4, whereby the p type doped region 5 is produced. As a diffusion method, vapor phase diffusion using a mask or thermal diffusion is employed. For example, thermal diffusion is performed as follows. Initially, an insulating film, such as an SiN film, is formed on the window layer 3, and a portion of the SiN film is removed to form an opening reaching the window layer 3, opposite a region where the p type doped region 5 is later produced. Then, a diffusion source, such as a ZnO film, is formed on the SiN film and on the window layer 3 exposed in the opening and, using the SiN film as a mask, the structure is subjected to thermal treatment for a prescribed time. In place of Zn, Cd (cadmium) or Be (beryllium) may be used for the diffusion.

After removal of the SiN film and the ZnO film, the surface protection film 2, which serves as an anti-reflection film, is formed on the surface of the window layer 3, preferably by plasma CVD. Then, a portion of the surface protection film 2 is removed to form an opening in a region where the p side electrode 1 is later produced, using photolithography and etching with hydrofluoric acid. Further, a photoresist film (not shown) is applied to the surface protection film 2 and patterned to form an opening on the opening of the surface protection film 2. Thereafter, a Ti/Au film is deposited using electron beam (EB) deposition, and unnecessary portions of this film on the photoresist film and the photoresist film are removed by lift-off, leaving the p side electrode 1. Simultaneously with the formation of the p side electrode 1, a bonding pad connected to the p side electrode 1 is formed on the surface protection film 2. Finally, the rear surface of the substrate 7 is ground and the n side electrode 8 is formed to complete the semiconductor light detecting element shown in FIG. 1.

The operation of the device will be described. When light 9 having a wavelength λ of 1.3 μm is applied to the doped region 5 from the top of the photodetector, the incident light 9 travels through the surface protection film 2 and the InP window layer 3, and it is absorbed in the InGaAs light absorption layer 4, thereby generating electrons and holes. At this time, in the light responsive region, i.e., a region of the i type InGaAs light absorption layer 4 opposite the doped region 5, a depletion layer 6 is produced due to a pn junction that is formed between the p type doped region 5 formed by Zn diffusion and the n type substrate 7, and an electric field is produced in the depletion layer 6 in the InGaAs light absorption layer 4. Electrons and holes generated by light absorption in the depletion layer 6 in the light absorption layer 4 are pulled by this electric field, and flow toward the n type InP substrate 7 and the p type doped region 5, respectively, thereby generating a photocurrent. This photocurrent is taken out as a signal current from the p side electrode 1 and the n side electrode 8. Further, a reverse bias may be applied across the p side electrode 1 and the n side electrode 8 as desired.

Next, the function and effect of the photodetector will be described.

A portion of the incident light 9, which has not been absorbed in but has traveled through the light absorption layer 4, is absorbed by the light absorption recombination layer 12 having a band gap energy smaller than the band gap energy of the light absorption layer 4. Since a dopant impurity is added to the light absorption recombination layer 12, electrons and holes generated in this layer recombine immediately. Thereby, response distortion caused by light that has not been absorbed in but has traveled through, the light absorption layer 4 and has been reflected by the n side electrode 8 into a region of the light absorption layer 4 where the depletion layer 6 is not present is avoided.

A description is now given of the effect of the n type InP barrier layer 11.

Electrons and holes generated in the light absorption recombination layer 12 diffuse about 1 μm before they recombine, so that some of the diffusing electrons and holes reach the depletion layer 6 and are taken out as a photocurrent. A current component taken out as such a photocurrent after diffusion becomes a distortion component of the signal. In the photodetector according to this first embodiment, however, the InP barrier layer 11 having a band gap energy (Eg=1.35 eV) larger than the band gap energy (Eg=0.75 eV) of InGaAs is included, and this barrier layer 11 prevents electrons and holes from diffusing into the depletion layer 6, thereby avoiding response distortion due to electrons and holes generated in the light absorption recombination layer 12.

Further, the thickness of the light absorption recombination layer 12 is desired to be larger than about 2 μm so that the layer 12 can absorb most of the light transmitted through the light absorption layer 4.

Furthermore, as a dopant impurity to be added to the light absorption recombination layer 12, any of the following dopant impurities may be employed: a donor impurity such as Si or S, an acceptor impurity such as Zn, Cd, or Be, a hole capture impurity, such as Cr (chromium), that produces a semi-insulating property in a second conductivity type semiconductor layer, and an electron capture impurity, such as Fe (iron), that produces a semi-insulating property in a first conductivity type semiconductor layer. When an acceptor impurity or an electron capture impurity is employed, an npn structure is produced between the barrier layer 11 and the substrate 7, and this npn structure blocks the current flow from the p side electrode to the n side electrode. In this case, the n side electrode must be disposed on the upper surface of the chip, outside the Zn diffused region 5.

Figure 9:
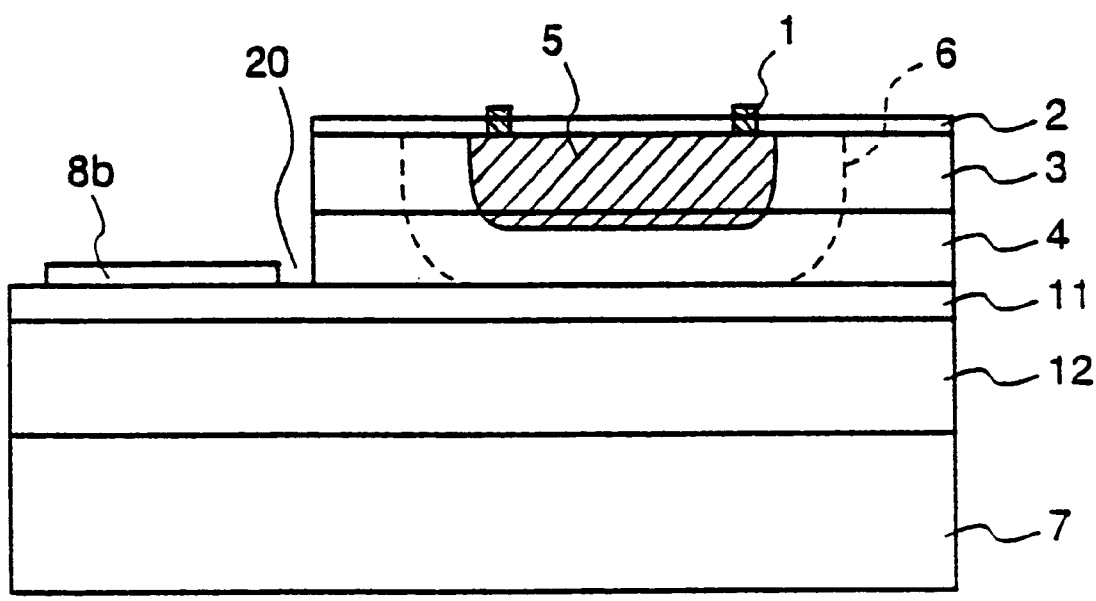
FIG. 9 is a cross-sectional view illustrating a semiconductor photodetector according to the first embodiment of the invention.

FIG. 9 shows a preferable structure in this case. In FIG. 9, the same reference numerals as those shown in FIG. 1 designate the same or corresponding parts. Reference numeral 20 designates an opening, and numeral 8b designates an n side electrode.

The structure shown in FIG. 9 is fabricated as follows. Epitaxial growth of the respective layers on the substrate 7 and formation of the doped region 5 are identical to those already mentioned for the first embodiment. After forming the doped region 5, an opening 20 is formed in a prescribed region outside the doped region 5, penetrating through the window layer 3 and the light absorption layer 4 and reaching the barrier layer 11. Preferably, this opening 20 is formed by selective etching. Thereafter, an n side electrode 8b is formed on the barrier layer 11 exposed at the bottom of the opening 20.

As described above, according to the first embodiment of the invention, the light absorption recombination layer 12 containing a dopant impurity and the barrier layer 11 are formed on the substrate 7 and, thereafter, the light absorption layer 4 is formed on the barrier layer 11. Therefore, a portion of incident light, which has not been absorbed in the light absorption layer 4, is absorbed in the light absorption recombination layer 12, and generated electrons and holes do not remain in this layer 12 but recombine immediately.

As a result, response distortion caused by the injection of remaining electrons and holes into the depletion layer 6 is reduced.

Embodiment 2

Figure 2:
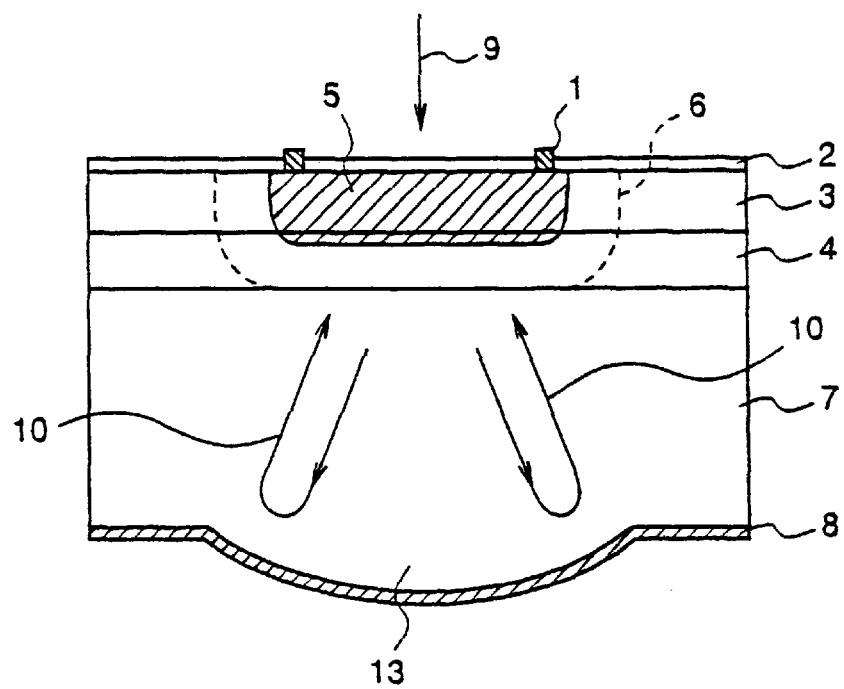
FIG. 2 is a cross-sectional view illustrating a semiconductor photodetector according to a second embodiment of the invention.

FIG. 2 is a cross-sectional view illustrating a semiconductor photodetector according to a second embodiment of the present invention.

In the figure, the same reference numerals as those shown in FIG. 1 designate the same or corresponding parts. Reference numeral 13 designates a projecting portion of the substrate 7 projecting outwards from the lower surface of the substrate 7. This projecting portion 13 serves as a concave mirror for incident light 9 which is applied to the surface of the chip and travels toward the rear surface of the substrate 7. The doped region 5 is produced opposite the projecting portion 13 of the substrate 7.

A description is given of the fabrication process of the photodetector shown in FIG. 2. Crystal growth of the light absorption layer 4 and the window layer 3 on the substrate 7, formation of the doped region 5, and formation of the p side electrode 1 are identical to those mentioned for the first embodiment of the invention. After formation of the p side electrode 1, the lower surface of the substrate 7 is subjected to anisotropic etching, such as RIE (Reactive Ion Etching), using a resist pattern, thereby producing the projecting portion 13 of the substrate 7. Finally, the n side electrode 8 is formed on the rear surface of the substrate 7. In the etching process, for example, a resist pattern for forming the projecting portion 13 is disposed on a portion of the rear surface of the substrate 7, which portion will be a central portion of the projecting portion 13.

In the photodetector so fabricated, a portion of incident light 9 which has not been absorbed in but traveled through the light absorption layer 4 reaches the substrate 7, and it is reflected by the concave mirror, i.e., the projecting portion 13 of the substrate 7, toward the center of the substrate. The light 10 so reflected is input to the depletion layer 6 in the light absorption layer 4 and absorbed in the depletion layer 6. Therefore, no reflected light 10 is absorbed in a region of the light absorption layer 4 outside the depletion layer 6, so that a photocurrent producing a distortion component is not produced, resulting in a semiconductor photodetector with reduced response distortion. In addition, since the reflected light 10 is absorbed by the depletion layer 6, the efficiency in absorbing incident light is improved.

Embodiment 3

Figure 3:
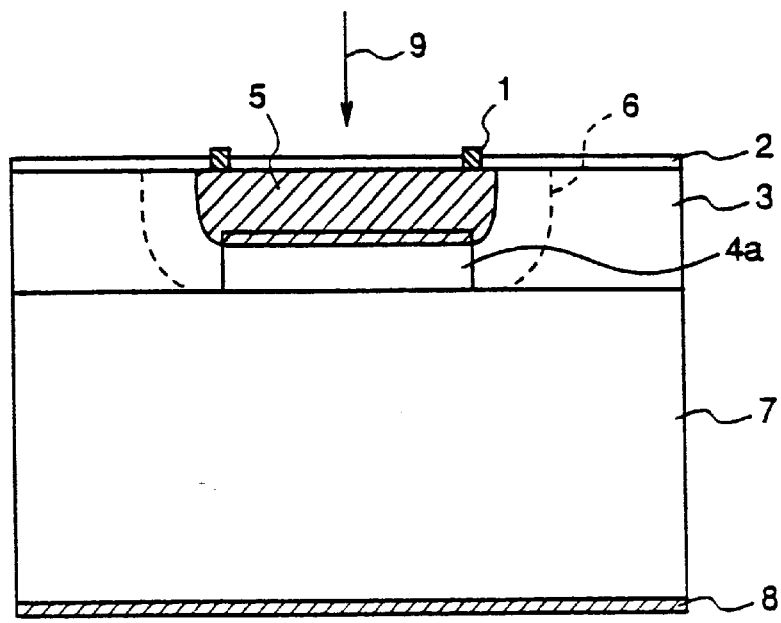
FIG. 3 is a cross-sectional view illustrating a semiconductor photodetector according to a third embodiment of the invention.

FIG. 3 is a cross-sectional view illustrating a semiconductor photodetector according to a third embodiment of the present invention. In FIG. 3, the same reference numerals as those shown in FIG. 1 designate the same or corresponding parts. Reference numeral 4a designates an i type InGaAs light absorption layer disposed only beneath the doped region 5.

The photodetector according to this third embodiment is fabricated as follows. After epitaxial growth of an i type InGaAs layer on the substrate 7, the i type InGaAs layer, except a portion to become the i type InGaAs light absorption layer 4a, is selectively removed using a mask or the like (not shown), thereby forming the light absorption layer 4a on a portion of the substrate 7. After removal of the mask, the window layer 3 is grown on the substrate 7 and on the light absorption layer 4a, followed by formation of the doped region 5 reaching into the light absorption layer 4a. Thereafter, the anti-reflection film 2, the p side electrode 1, and the n side electrode 8 are produced to complete the photodetector.

In the photodetector so fabricated, since the light absorption layer 4a is disposed within the depletion layer 6 which is produced between the doped region 5 and the substrate 7, light absorption does not occur in a region outside the depletion layer 6. Hence, a portion of the incident light, which has not been absorbed in the light absorption layer 4a and has been reflected by the n side electrode 8, is not absorbed in a region outside the light absorption layer 4a in the depletion region 6. Accordingly, response distortion caused by such reflected light is avoided, resulting in a semiconductor photodetector with reduced response distortion.

Embodiment 4

Figure 4:
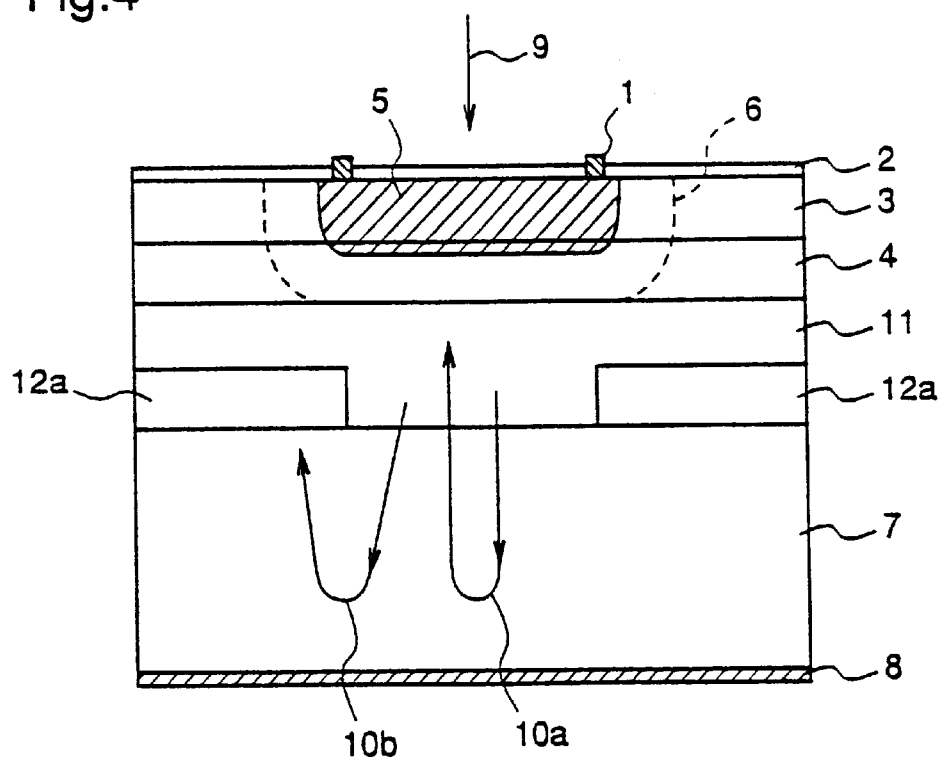
FIG. 4 is a cross-sectional view illustrating a semiconductor photodetector according to a fourth embodiment of the invention.

FIG. 4 is a cross-sectional view illustrating a semiconductor photodetector according to a fourth embodiment of the invention. In FIG. 4, the same reference numerals as those shown in FIG. 1 designate the same or corresponding parts. Reference numeral 12a designates a light absorption recombination layer disposed on the substrate 7 except on a region opposed to the doped region 5. The light absorption recombination layer 12a comprises the same material as the light absorption recombination layer 12 according to the first embodiment.

The photodetector according to this fourth embodiment is fabricated as follows. In the fabrication process of the photodetector according to the first embodiment, after epitaxially growing the light absorption recombination layer 12 on the substrate 7, a portion of the light absorption recombination layer 12, opposite a region where the doped region 5 is produced later, is removed to form an opening reaching the substrate 7, thereby producing the light absorption recombination layer 12a. Thereafter, the barrier layer 11, the light absorption layer 4, and the window layer 3 are epitaxially grown on the light absorption recombination layer 12a and on the substrate 7 exposed in the opening.

In the photodetector so fabricated, a portion of incident light 9, which has not been absorbed in the light absorption layer 4, is reflected by the n side electrode 8. The reflected light 10b, which travels toward a region outside the depletion layer 6 beneath the doped region 5, is input to and absorbed by the light absorption recombination layer 12a, and holes and electrons produced in this layer 12a do not remain but are recombine, whereby response distortion is reduced. In addition, since the light absorption recombination layer 12a has an opening opposite the depletion layer 6 beneath the doped region 5, the reflected light 10a, which travels toward the depletion layer 6, is efficiently absorbed in the depletion layer 6 and converted into a photocurrent, whereby the efficiency of light absorption is improved.

Embodiment 5

Figure 5:
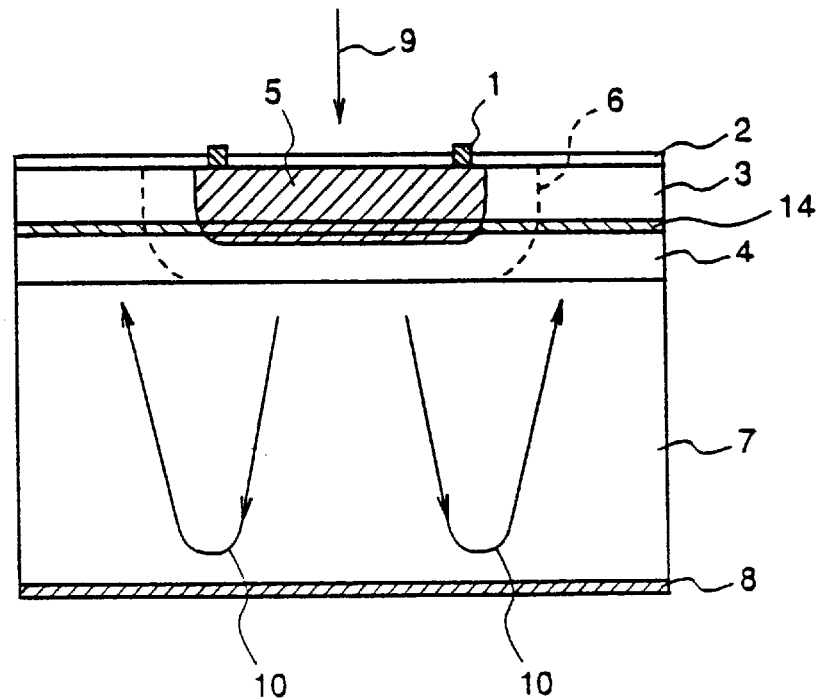
FIG. 5 is a cross-sectional view illustrating a semiconductor photodetector according to a fifth embodiment of the invention.

FIG. 5 is a cross-sectional view illustrating a semiconductor photodetector according to a fifth embodiment of the present invention. In FIG. 5, the same reference numerals as those shown in FIG. 1 designate the same or corresponding parts. Reference numeral 14 designates an undoped lattice mismatch layer comprising a material that does not lattice match with the light absorption layer 4. For example, when the light absorption layer 4 comprises $In_{0.53}Ga_{0.47}As$, $In_xGa_{1-x}As$ ($x \neq 0.53$) is employed as the material of the lattice mismatch layer 14. The lattice mismatch layer 14 should be thinner than a critical thickness beyond which dislocations occur due to lattice mismatch caused by distortion of the crystal lattice. For example, the lattice mismatch layer 14 is 10~100 nm thick. In addition, the lattice mismatch layer 14 comprises a material having a band gap energy smaller than the band gap energy of the light absorption layer 4.

In order to fabricate the photodetector according to this fifth embodiment, in the fabrication process according to the first embodiment, a light absorption recombination layer and a barrier layer are not grown, and the lattice mismatch layer 14 is grown on the light absorption layer 4. Further, Zn diffusion to produce the doped region 5 is performed so that Zn diffuses through the lattice mismatch layer 14 and reaches into the light absorption layer 4.

Generally, the lattice mismatch layer 14 has a higher electron-hole recombination rate than a lattice match layer. As already described in the BACKGROUND OF THE INVENTION section, when a portion of the reflected light 10 from the n side electrode 8 is input to and absorbed in a region outside the depletion layer 6 of the light absorption layer 4, electrons and holes are generated. Since the recombination rate of the light absorption layer 4 is not so high, some of these electrons and holes remain in the layer 4 or diffuse into the depletion layer 6 before recombination, resulting in response distortion. In this fifth embodiment of the invention, however, since the lattice mismatch layer 14 having a high recombination rate abuts the light absorption layer 4, electrons and holes which cause response distortion flow into the lattice mismatch layer 14 and recombine in this layer 14, before reaching the depletion layer 6. As a result, a semiconductor photodetector with reduced response distortion is realized.

Embodiment 6

Figure 6:
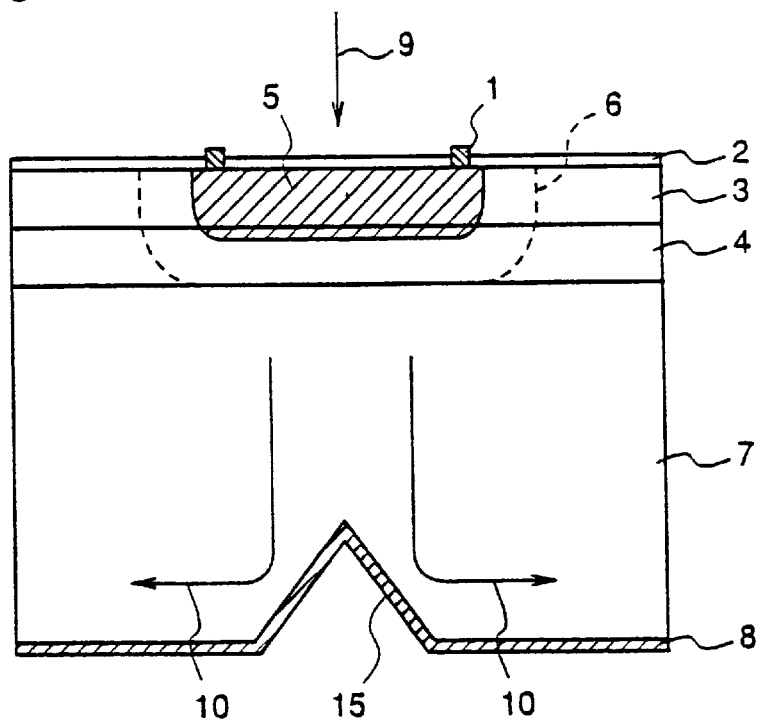
FIG. 6 is a cross-sectional view illustrating a semiconductor photodetector according to a sixth embodiment of the invention.

FIG. 6 is a cross-sectional view illustrating a semiconductor photodetector according to a sixth embodiment of the present invention. In FIG. 6, the same reference numerals as those shown in FIG. 2 designate the same or corresponding parts. Reference numeral 15 designates a V groove formed at the lower surface of the substrate 7 opposite the doped region 5.

The process steps for fabricating the photodetector according to this sixth embodiment are identical to those already described for the second embodiment except that the V groove 15 is formed at the lower surface of the substrate 7 in place of the projecting portion 13. The V groove 15 is easily produced by determining the crystalline orientation along which the V groove extends, and wet etching using a mask and an etchant having a selectivity with respect to the crystalline orientation. Alternatively, anisotropic etching may be employed.

In the photodetector according to this sixth embodiment, the V groove 15 is present in a position to which the incident light 9 traveling through the light absorption layer 4 is applied, i.e., only beneath the doped region 5. So, a portion of the incident light 9, which has not been absorbed by the light absorption layer 4, is reflected at both sides of the V groove 15 when reflected by the n side electrode 8, towards opposite sides of the device. The reflected light 10 is emitted to the outside of the device. Since the reflected light 10 is not input light absorption layer 4, undesired absorption of the reflected light 10 in a region of the light absorption layer 4 where the depletion layer 6 is absent is avoided, resulting in a semiconductor photodetector with reduced response distortion.

Embodiment 7

Figure 7:
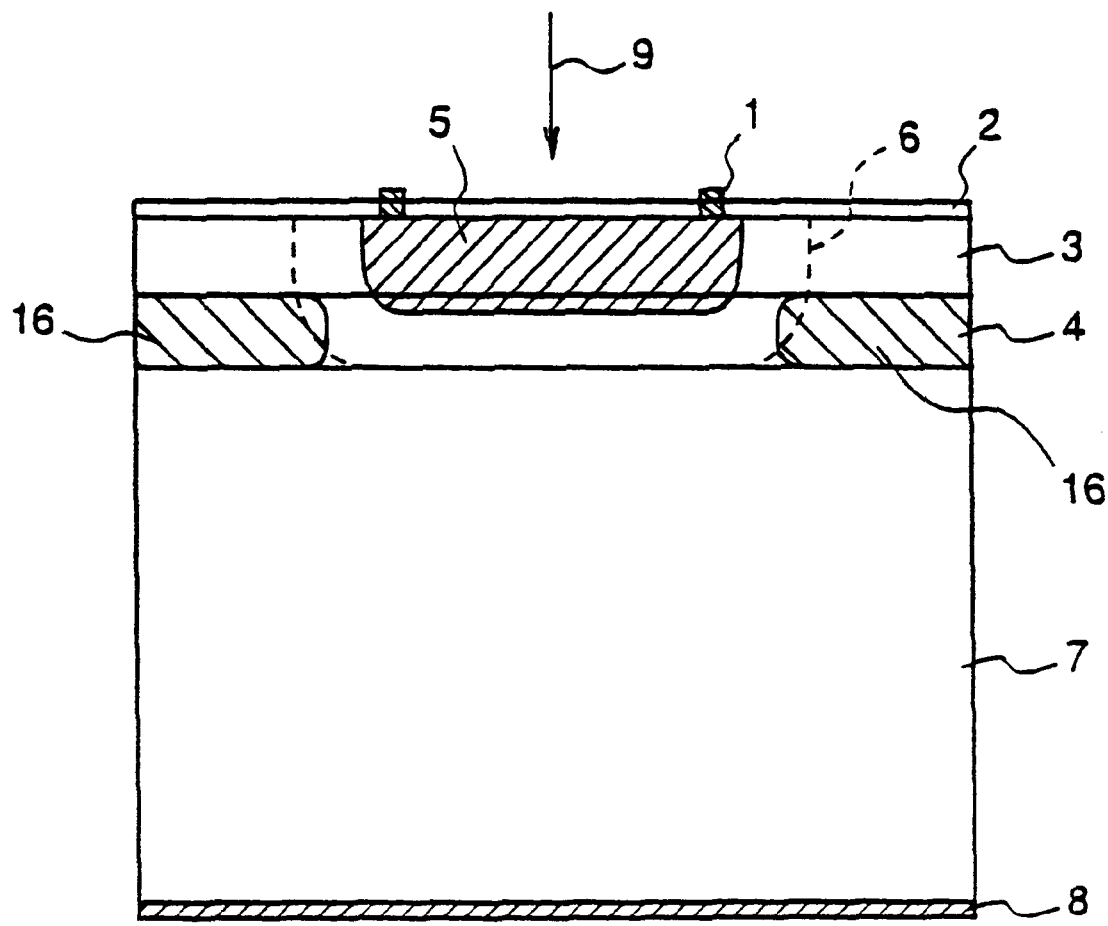
FIG. 7 is a cross-sectional view illustrating a semiconductor photodetector according to a seventh embodiment of the invention.
Figure 8:
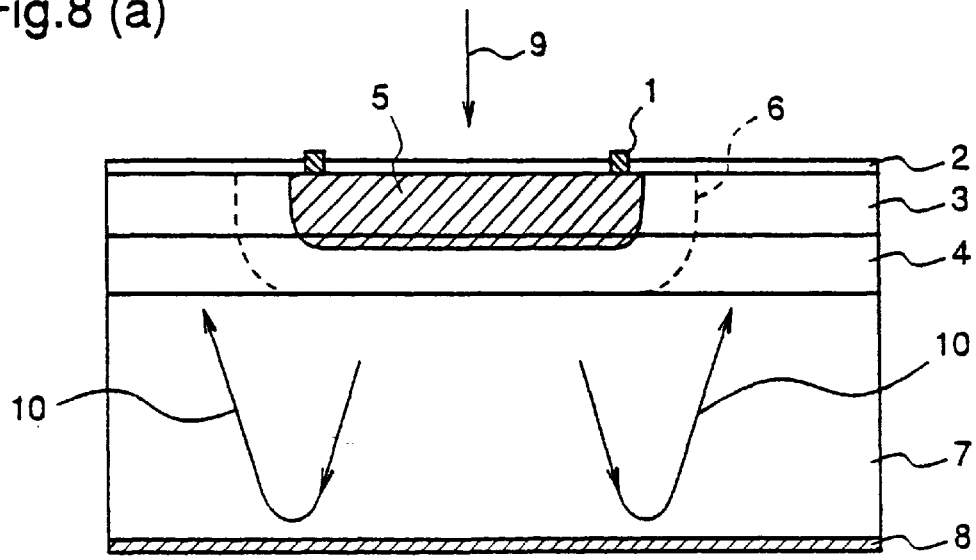
FIGS. 8(a) and 8(b) are a cross-sectional view and a top plan view, respectively, illustrating a semiconductor photodetector according to the prior art.
Figure 8:
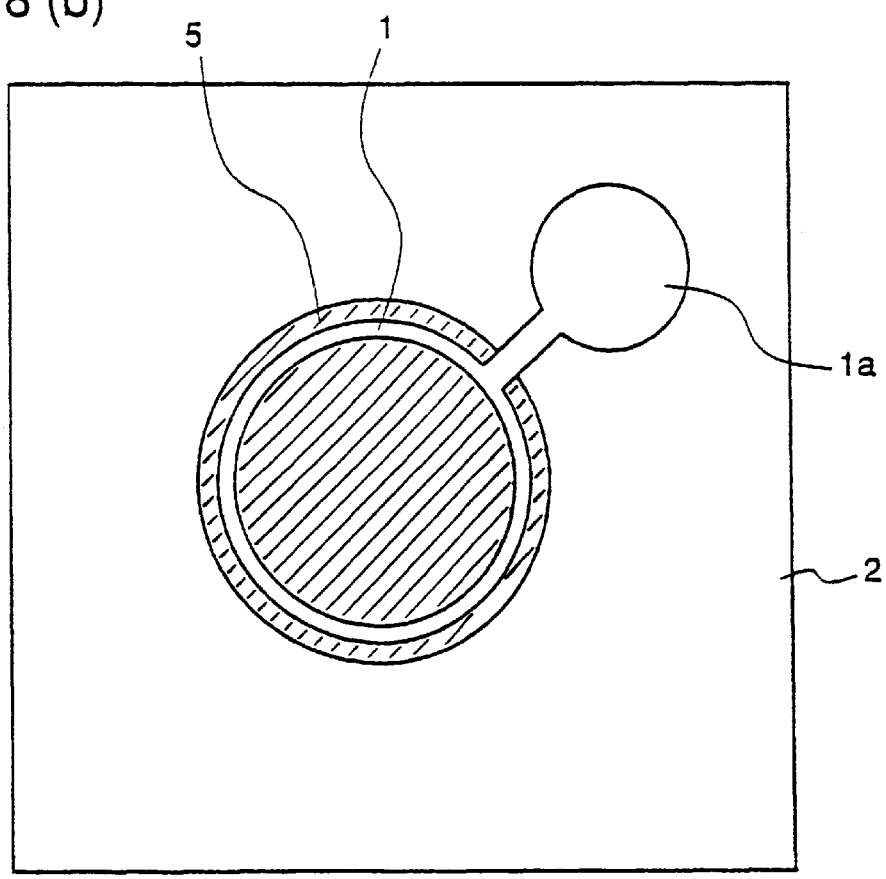

FIG. 7 is a cross-sectional view illustrating a semiconductor photodetector according to a seventh embodiment of the present invention. In FIG. 7, the same reference numerals as those shown in FIG. 1 designate the same or corresponding parts. Reference numeral 16 designates a doped region for recombination (hereinafter referred to as a recombination region), produced in the light absorption layer 4, except in a region opposite to the doped region 5, by ion implantation or diffusion of a dopant impurity. For example, Si is used to make a region having a relatively high carrier concentration of $1\times10^{19}$ cm$^{-3}$. As a dopant impurity for the recombination region 16, any of the dopant impurities described for the light absorption recombination layer 12 according to the first embodiment can be employed. The thickness of the recombination region 16 is at least half of the thickness of the light absorption layer 4.

To fabricate the photodetector according to this seventh embodiment, in the fabrication process according to the first embodiment, the light absorption layer 12 and the barrier layer 11 are not grown and, after formation of the doped region 5, the recombination region 16 is formed in the light absorption layer 4 by ion implantation of a dopant impurity. Alternatively, after the light absorption layer 4 is grown, the recombination region 16 is formed in the light absorption layer 4 by diffusion of a dopant impurity, followed by growth of the window layer 3.

Generally, the electron-hole recombination rate is higher in a region doped with a dopant impurity than in a region free of the dopant impurity. In the photodetector according to this seventh embodiment, since the recombination region 16 has a high electron-hole recombination rate, even though the reflected light 10 is absorbed and electrons and holes are generated in a region of the light absorption layer 4 outside the depletion layer 6, i.e., in the recombination region 4, these electrons and holes recombine in a short time. Therefore, unwanted flow of electrons and holes into the depletion layer 6 is avoided, resulting in a semiconductor photodetector with reduced response distortion.

Although in the first to seventh embodiments the wavelength of incident light is 1.3 μm, the semiconductor photodetector according to any of these embodiments can be used for incident light of other wavelengths by changing the materials and compositions of the respective layers according to the wavelength of the incident light. Also in this case, the same effects as mentioned above are obtained.

In the first to seventh embodiments of the invention, emphasis has been placed on an InP series semiconductor photodetector employing an InP substrate and an InGaAs light absorption layer. However, similar semiconductor photodetectors employing other materials, for example, an InAlGaAs/InGaAs series semiconductor photodetector employing an InGaAs light absorption layer or a GaAs series semiconductor photodetector employing a GaAs substrate, are also within the scope of the present invention and, in these cases, the same effects as mentioned above are obtained.

What is claimed is:

1. A semiconductor photodetector comprising:

a semiconductor substrate of a first conductivity type, having a band gap energy and front and rear surfaces;

a light absorption recombination layer disposed on the front surface of the semiconductor substrate and comprising a semiconductor layer containing a dopant impurity and having a band gap energy smaller than the band gap energy of the semiconductor substrate;

a barrier layer disposed on the light absorption recombination layer and comprising a first conductivity type semiconductor layer having a band gap energy larger than the band gap energy of the light absorption recombination layer;

a light absorption layer disposed on the barrier layer and comprising an undoped semiconductor layer having a band gap energy larger than the band gap energy of the light absorption recombination layer and smaller than the band gap energy of the barrier layer;

a window disposed on the light absorption layer and comprising an undoped semiconductor layer having a band gap energy larger than the band gap energy of the light absorption layer; and an impurity doped region of a second conductivity type, opposite the first conductivity type, in a region extending from the window layer and into the light absorption layer, wherein the light absorption recombination layer has an opening in which a portion of the semiconductor substrate is exposed, the barrier layer is disposed on the light absorption recombination layer and fills the opening, and the impurity doped region is opposite the opening.

2. The semiconductor photodetector of claim 1 wherein the dopant impurity contained in the light absorption recombination layer is selected from the group of dopant impurities producing the first conductivity type in the light absorption recombination layer and producing a semi-insulating semiconductor layer, the device comprising:

a first electrode disposed on the rear surface of the semiconductor substrate; and a second electrode disposed on a portion of the impurity doped region.

* * * * *